(12) United States Patent
Eid et al.

(10) Patent No.: US 10,424,559 B2
(45) Date of Patent: Sep. 24, 2019

(54) THERMAL MANAGEMENT OF MOLDED PACKAGES

(71) Applicant: Intel Corporation, Santa Clara, CA (US)

(72) Inventors: Feras Eid, Chandler, AZ (US); Nader N. Abazarnia, Chandler, AZ (US); Johanna M. Swan, Scottsdale, AZ (US); Taesha D. Beasley, Chandler, AZ (US); Sasha N. Oster, Chandler, AZ (US); Tannaz Harirchian, Chandler, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/388,906

(22) Filed: Dec. 22, 2016

(65) Prior Publication Data

US 2018/0182736 A1    Jun. 28, 2018

(51) Int. Cl.
*H01L 25/065* (2006.01)
*H01L 23/373* (2006.01)
(Continued)

(52) U.S. Cl.
CPC ........ *H01L 25/0657* (2013.01); *H01L 21/565* (2013.01); *H01L 23/3677* (2013.01); *H01L 23/3736* (2013.01); *H01L 23/481* (2013.01); *H01L 23/49827* (2013.01); *H01L 23/3121* (2013.01); *H01L 23/3128* (2013.01);
(Continued)

(58) Field of Classification Search
CPC .......... H01L 23/49827; H01L 23/3737; H01L 25/0657
See application file for complete search history.

(56) References Cited

U.S. PATENT DOCUMENTS

| | | | |
|---|---|---|---|
| 5,866,952 A * | 2/1999 | Wojnarowski | H01L 21/568 257/788 |
| 7,170,188 B2 | 1/2007 | Matayabas | |

(Continued)

OTHER PUBLICATIONS

The International Searching Authority, Notification of Transmittal of the International Search Report and the Written Opinion of the International Searching Authority dated Mar. 5, 2018 in International Application No. PCT/US2017/061653.
(Continued)

*Primary Examiner* — Tucker J Wright
*Assistant Examiner* — Wilner Jean Baptiste
(74) *Attorney, Agent, or Firm* — Trop, Pruner & Hu, P.C.

(57) ABSTRACT

An embodiment includes an apparatus comprising: a semiconductor die; package molding that is molded onto and conformal with a first die surface of the semiconductor die and at least two sidewalls of the semiconductor die, the package molding including: (a)(i) a first surface contacting the semiconductor die, (a)(ii) a second surface opposite the first surface, and (a)(iii) an aperture that extends from the first surface to the second surface; and a polymer substantially filling the aperture; wherein the package molding includes a first thermal conductivity (watts per meter kelvin (W/(m·K)) and the polymer includes a second thermal conductivity that is greater than the first thermal conductivity. Other embodiments are described herein.

27 Claims, 8 Drawing Sheets

(51) Int. Cl.
*H01L 23/48* (2006.01)
*H01L 23/498* (2006.01)
*H01L 21/56* (2006.01)
*H01L 23/367* (2006.01)
*H01L 23/31* (2006.01)
*H01L 23/00* (2006.01)

(52) U.S. Cl.
CPC .............. *H01L 24/16* (2013.01); *H01L 24/48* (2013.01); *H01L 2224/16227* (2013.01); *H01L 2224/16235* (2013.01); *H01L 2225/0651* (2013.01); *H01L 2225/0652* (2013.01); *H01L 2225/06517* (2013.01); *H01L 2225/06548* (2013.01); *H01L 2225/06575* (2013.01); *H01L 2225/06589* (2013.01); *H01L 2924/0715* (2013.01); *H01L 2924/1205* (2013.01); *H01L 2924/1206* (2013.01); *H01L 2924/1304* (2013.01); *H01L 2924/1436* (2013.01)

(56) References Cited

U.S. PATENT DOCUMENTS

| | | | |
|---|---|---|---|
| 7,960,827 | B1 | 6/2011 | Miller, Jr. et al. |
| 2002/0079573 | A1* | 6/2002 | Akram ................ H01L 21/563 257/718 |
| 2009/0001551 | A1* | 1/2009 | Wan .................... H01L 21/568 257/701 |
| 2010/0133704 | A1* | 6/2010 | Marimuthu .......... H01L 21/565 257/778 |
| 2012/0086003 | A1* | 4/2012 | Park .................... H01L 21/56 257/48 |
| 2012/0187332 | A1 | 7/2012 | Iruvanti et al. |
| 2013/0277821 | A1 | 10/2013 | Lundberg |
| 2014/0054760 | A1* | 2/2014 | Yu ...................... H01L 23/34 257/692 |
| 2014/0291834 | A1* | 10/2014 | Gandhi ................ H01L 21/563 257/737 |
| 2015/0061095 | A1 | 3/2015 | Choi et al. |
| 2015/0155218 | A1* | 6/2015 | Hung .................. H01L 23/36 257/690 |
| 2015/0235990 | A1* | 8/2015 | Cheng ................. H01L 25/50 257/712 |
| 2015/0279805 | A1* | 10/2015 | Karhade .............. H01L 25/50 257/737 |
| 2016/0300774 | A1* | 10/2016 | Kim .................... H01L 23/367 |
| 2016/0334845 | A1 | 11/2016 | Mittal et al. |
| 2017/0178990 | A1* | 6/2017 | Oster .................. H01L 21/565 |

OTHER PUBLICATIONS

Oster, Sasha et. al, "Through-Mold Structures," U.S. Appl. No. 14/973,184, filed Dec. 17, 2015.
Oster, Sasha et. al, "Complex Cavity Formation in Molded Packaging Structures," U.S. Appl. No. 15/085,538, filed Mar. 30, 2016.
Gilleo, Ken et. al., "Step 10: Encapsulation Materials, Processes and Equipment," Solid State Technology, http://electroiq.com/blog/2004/10/step-10-encapsulation-imaterials-processes-and-equipment-i/, accessed Nov. 18, 2016, 8 pages.

\* cited by examiner

THERMAL MANAGEMENT OF MOLDED PACKAGES

TECHNICAL FIELD

Embodiments of the invention concern electronic packaging, such as molded microelectronic packaging.

BACKGROUND

As noted in U.S. Pat. No. 7,170,188, assigned to Intel Corp. of Santa Clara, Calif., USA, integrated circuits (IC) are typically housed within a package that is mounted to a printed circuit board (PCB). The package has conductive leads or pins that are soldered or otherwise coupled to the PCB and further coupled to the IC. One kind of package commonly referred to as a ball grid array (BGA) is an IC package which has a plurality of solder balls that interconnect the package to a PCB. The solder balls are attached to an organic dielectric based substrate which has a number of conductive traces and accompanying solder pads. The IC die is connected to the solder pads of the substrate by wire bonds or solder bumps and electrically coupled to the solder balls on the PCB side through conductive traces routed across the substrate.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1A:
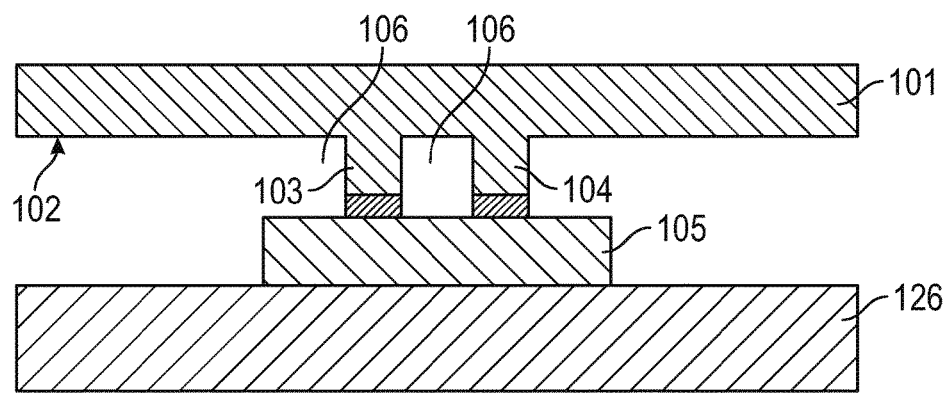
FIGS. 1A, 1B, and 1C depict stages of an overmold process in an embodiment concerning a single-chip package.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Regarding the packages described above, molding compounds (sometimes also referred to herein as molding materials or encapsulants) help form the packages by encapsulating a semiconductor die (which includes an IC) or stack of die and provide mechanical support to thin substrates. However, Applicant has determined those compounds typically have low thermal conductivities which can result in thermal management challenges.

For example, Applicant determined that during testing of packages the high thermal resistance of the molding compound produces higher junction temperatures and slower response times compared to unmolded packages. This can lead to longer test times, lower throughput, and potential thermal failure of some package components that are not able to withstand the elevated temperatures during test and in end use applications.

However, an embodiment addresses these thermal issues. For instance, an embodiment uses different materials to improve thermal characteristics of a package. One material includes a low thermal conductivity molding compound to cover a portion of the package area. Another material includes a higher thermal conductivity material that is patterned to fill strategic locations within the low thermal conductivity molding compound to enhance thermal characteristics of the package by providing a low thermal resistance path between, for example, hot spots of the die and the surface of a package substrate.

Figure 1B:
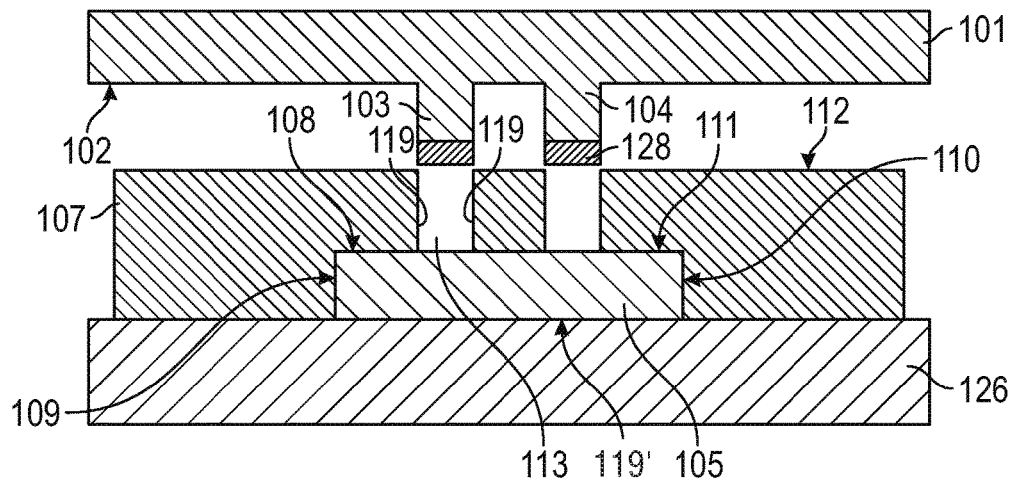
Figure 1C:
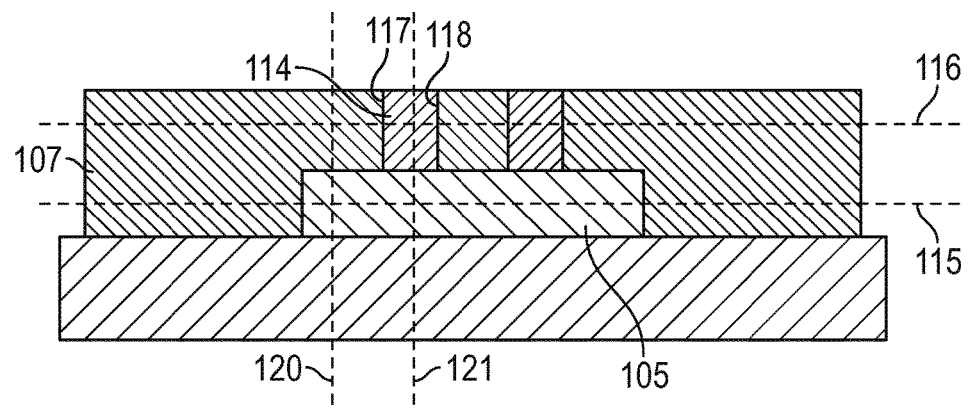
Figure 5:
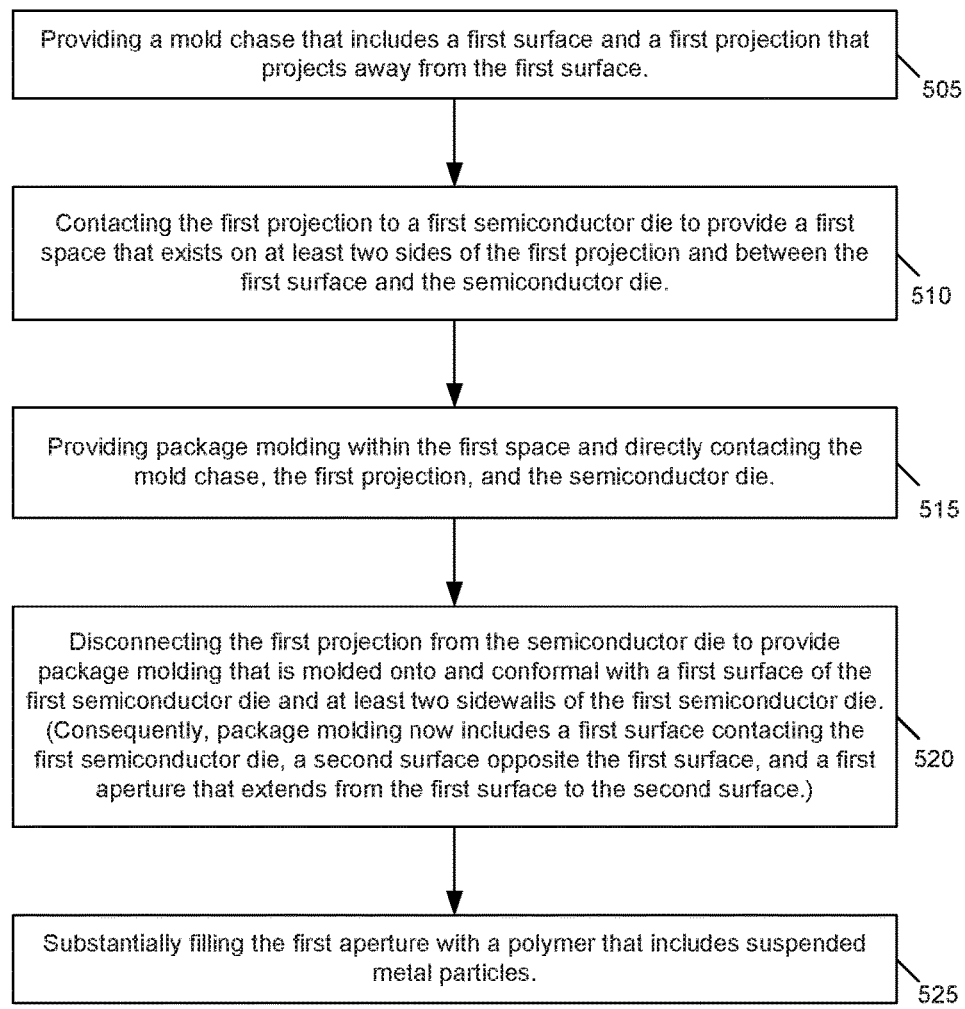
FIG. 5 depicts an overmold process in an embodiment.

FIG. 5 includes a method 500 in an embodiment. In explaining method 500 FIGS. 1A, 1B, and 1C are also addressed.

Block 505 includes providing a mold chase 101 that includes a first surface 102 and a first projection 103 that projects away from the first surface. Other projections may exist (e.g., projection 104) but discussion is limited to projection 103 for brevity.

Block 510 includes contacting (FIG. 1A) the first projection 103 to a first semiconductor die 105 (which may be on substrate 126, such as a printed circuit board (PCB) or other such substrate) to provide a first space 106 that exists on at least two sides of the first projection 103 and between the first surface 102 and the semiconductor die 105.

Block 515 includes providing package molding 107 ("package molding" is sometimes also referred to herein as "molding materials", which may include molding compounds or other such molding materials) within the first space and directly contacting the mold chase 101, the first projection 103, and the semiconductor die 105. Block 520 includes disconnecting (FIG. 1B) the first projection 103 from the semiconductor die to provide package molding 107 that is molded onto and conformal with a first surface 108 of the first semiconductor die 105 and at least two sidewalls 109, 110 of the first semiconductor die. Package molding 107 may include a first surface 111 contacting the first semiconductor die, a second surface 112 opposite the first surface 111, and a first aperture 113 that extends from the first surface 111 to the second surface 112.

Block 525 includes substantially filling (FIG. 1C) the first aperture 113 with a polymer 114. In some embodiments polymer 114 includes suspended or sintered metal or thermally conductive particles.

In FIG. 1C semiconductor die 105 includes a major first axis 115 (i.e., the horizontal axis is the long or "major" axis considering the die is wider in the horizontal dimension than it is tall in the vertical dimension, which in this case would define a "minor" axis). A second axis 116, which is parallel to the first axis, intersects the polymer 114. Axis 116 also intersects the package molding 107 on opposing sides 117, 118 of the polymer 114. Die 105 includes a second surface 119', opposite the first surface 108, which is between the die 105 and substrate 126 (FIG. 1B). The die is between the substrate and the package molding (e.g., the die is between the substrate and at least a portion of the package molding). A third axis 120, orthogonal to the first and second axes, intersects the package molding 107 and the die 105 but not the polymer 114. A fourth axis 121, parallel to the third axis, intersects the polymer and the die but not the package molding. In an embodiment in a plane (e.g., horizontal plane including axis 116), which is parallel to the first axis 115, the rigid polymer 114 is completely surrounded by the package molding. Thus, while FIG. 1C shows a side cross section a top view would show, in an embodiment, a polymer 114 portion completely surrounded by molding 107 within the horizontal plane that includes axis 116.

In an embodiment, aperture 113 includes sidewalls 119 that are smooth. This is due to their formation using mold chase 101 (which has smooth sidewalls in an embodiment) and having mold material 107 form around the smooth-walled projection 103. In contrast, a drilled aperture (formed after package molding is overmolded onto die 105) would have rough side walls due to roughness caused by a drill bit. Other apertures may have rough sidewalls when formed by, for example, by etching. In an embodiment, sidewalls 119 may be circular or non-circular in a horizontal cross-section taken in a plane parallel to the first and second axes 115, 116. Again, this may be due to use of a cylindrical or non-cylindrical mold chase projection 103 (instead of a drill bit).

In an embodiment, package molding 107 has a first thermal conductivity (measured in watts per meter kelvin (W/(m·K)) and the polymer 114 has a second thermal conductivity that is greater than the first thermal conductivity. For example, in an embodiment the first thermal conductivity is less than 1 W/(m·K) and the second thermal conductivity is greater than 9 W/(m·K). These ranges are critical to provide for testing that has high throughput while not damaging components due to overheating of the components. In other embodiments the first thermal conductivity may be less than 0.5, 1.5, or 2 W/(m·K). In an embodiment the second thermal conductivity may be more than 2, 3, 4, 5, 6, 7, 8, 10, 11, 12 W/(m·K) or more. Applicant has determined many conventional package molding compounds have a thermal conductivity less than 1 W/m–K. For test, Applicant has further determined a conductivity in the range of at least 2.5-5 W/m–K can alleviate the high junction temperature and slow response time challenges seen with current mold materials. Embodiments include this critical range or higher for thermal conductivity within polymer 114, which can be applied as an ink or paste (left non-rigid or converted to a rigid or hardened state) that can be screen or stencil printed.

In an embodiment the package molding 107 comprises a polymer such as a thermoset polymer (e.g., thermoset epoxy), a thermoplastic polymer, a liquid crystal polymer (LCP), and/or mixtures thereof. In an embodiment polymer 114 is rigid. The rigidity may be due to crosslinking of the polymer (which is in contrast to non-rigid thermal interface materials (TIM) such as greases and the like). The polymer 114 may include a filler, such as metal or thermally conductive particles to promote thermal conductivity. The percentage of metal or thermally conductive particles may be higher in polymer 114 than package molding 107. As such, material 114 may help compensate for the lack of thermal conductivity in package molding 107. In an embodiment, material 114 includes 50, 60, 70, 80, 90% or more particles whereas the product package molding includes none of such materials (but may instead include nonconductive ceramic materials). Such particles may include copper, silver, aluminum, or other materials. Regarding TIM, material 114 is further distinguished from TIM in that material 114 also acts as an encapsulant and structural layer in the locations in which it is patterned alongside the molding compound 107. This is an important distinction from existing architectures using an exposed die (i.e., no package molding on top surface of die) and TIM whereby only the TIM (but no molding compound) is applied on the die surface. In fact, the embodiment of FIG. 1C may use a TIM on top of: (a) the final surface 112 of the molding compound 107 and/or (b) the polymer 114 (e.g., when increased thermal conduction is needed in the end product and not just during testing) but a TIM is not necessarily needed in all embodiments.

Thus, FIG. 1C illustrates a package architecture with two different encapsulant materials. A major portion of the substrate is covered by standard package molding compound (e.g., epoxy molding compound). However, a high conductivity material is also patterned in strategic locations to provide a thermal escape path for the heat generated in the die during operation of the die.

Figure 2A:
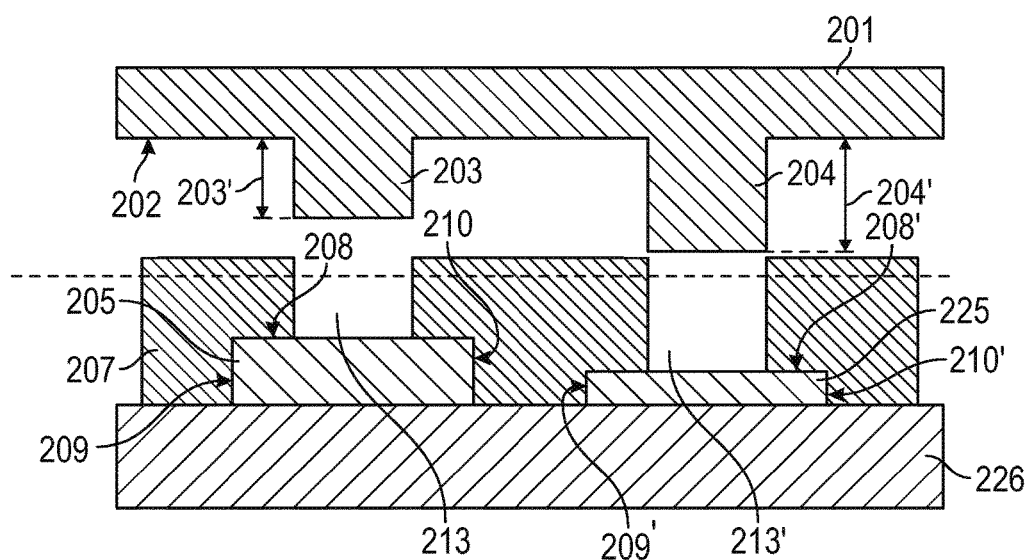
FIGS. 2A and 2B depict stages of an overmold process in an embodiment concerning a multi-chip package (MCP).
Figure 2B:
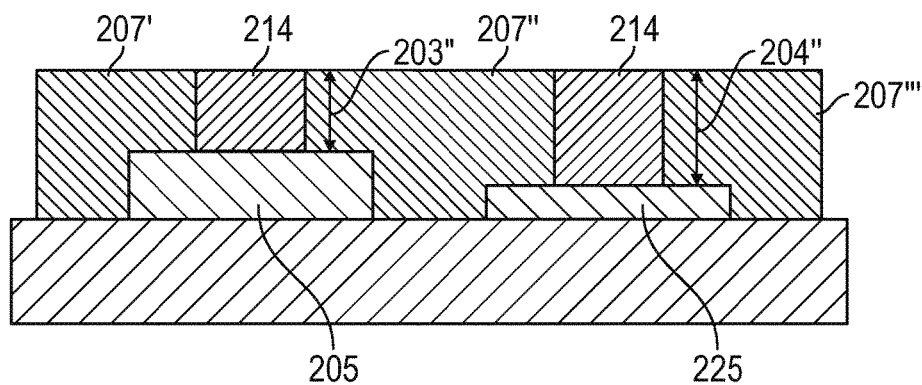
Figure 6:
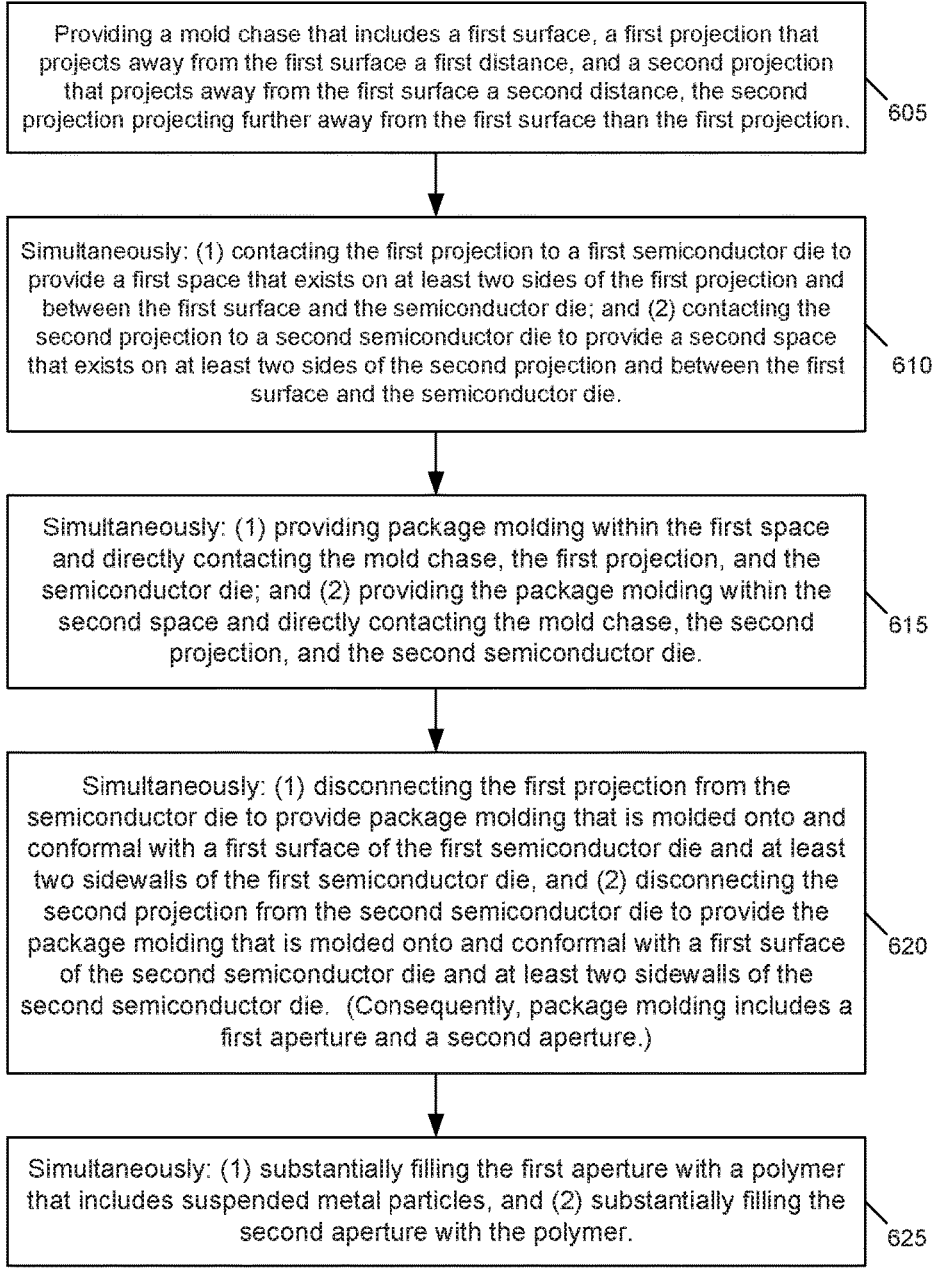
FIG. 6 depicts an overmold process in an embodiment.

FIG. 6 includes a method 600 in an embodiment. In explaining method 600 FIGS. 2A and 2B are also addressed.

Block 605 includes providing a mold chase 201 that includes a first surface 202, a first projection 203 that projects away from the first surface a first distance 203', and a second projection 204 that projects away from the first surface 202 a second distance 204', the second projection projecting further away from the first surface than the first projection. In the example shown in FIG. 2A, distance 204' is shown different than 203', but in other embodiments the two distances are equal.

Block 610 includes simultaneously: (1) contacting the first projection 203 to a first semiconductor die 205 to provide a first space (not shown) that exists on at least two sides of the first projection and between the first surface 202 and the semiconductor die 205; and (2) contacting the second projection 204 to a second semiconductor die 225 to provide a second space (not shown) that exists on at least two sides of the second projection and between the first surface and the semiconductor die 225. The first and second spaces are analogous to space 106 of FIG. 1A.

Block 615 includes simultaneously: (1) providing package molding 207 within the first space and directly contacting the mold chase, the first projection 203, and the semiconductor die 205; and (2) providing the package molding 207 within the second space and directly contacting the mold chase, the second projection 204, and the second semiconductor die 225 (which is over substrate 226).

Block 620 includes simultaneously: (1) disconnecting (FIG. 2A) the first projection from the semiconductor die to provide package molding 207 that is molded onto and conformal with a first surface 208 of the first semiconductor die and at least two sidewalls 209, 210 of the first semiconductor die, and (2) disconnecting the second projection (FIG. 2A) from the second semiconductor die 225 to provide the package molding that is molded onto and conformal with a first surface 208' of the second semiconductor die and at least two sidewalls 209', 210' of the second semiconductor die. Consequently, the package molding includes (FIG. 2A) a first aperture 213 and a second aperture 213' (which is deeper than the first aperture) However, as noted above, these apertures may have the same depth in other embodiments where distance 204' is equal to distance 203'.

Block 625 includes (FIG. 2B) simultaneously: (1) substantially filling (fully or partially) the first aperture with a polymer 214 (which may include suspended or sintered metal or thermally conductive particles), and (2) substantially filling (fully or partially) the second aperture with the polymer.

In an embodiment, height 204" is greater than height 203". Further, in an embodiment package molding 207 includes portions 207', 207", 207''' that are all monolithic with each other. For example, all portions 207', 207", 207''' are formed simultaneously around mold chase 201. Of course in other embodiments portions 207', 207", 207''' may include the same materials but may not necessarily be monolithic with each other. As used herein, "monolithic" means formed as a single piece of material without joints or seams and constituting a single unit.

In an embodiment, rigid polymer 214 directly contacts the semiconductor die 205 and/or die 225. For instance, had a copper plug been placed on dies 205, 225 instead of the polymer 214, such a plug may require an adhesive to couple the plug to a die (so there would be no direct contact between the copper plug and the die if the adhesive is between the plug and the die). However, no such adhesive is necessary in some embodiments that include rigid polymer 214.

Thus, a benefit of a process embodiment is that the process can be used with both single die packages as well as MCPs, even when the MCP has die of different thicknesses. This is an important advantage compared to, for example, using an exposed die mold (where package molding is not on a top surface of die in order to promote better cooling) for thermal management. In the exposed die MCP case, all the die have to be the same thickness in order to be all exposed, which is a limiting constraint that cannot be met in many cases.

In terms of fabrication, multiple approach embodiments can be used to realize the architectures addressed herein using high volume manufacturing (HVM) compatible processes. In one approach, a mold chase with pedestals can be used during molding to create cavities in standard molding compound (e.g., FIGS. 1A, 1B, and 1C). To ensure that the pedestals do not crack the die, and that cavities are completely void of the standard molding compound, a compliant layer (e.g., "soft-tack" pillow) can be attached to the bottom of the pedestals (e.g., layer 128 in FIG. 1B) to form a soft seal between the pedestals and die during molding. Such pillows may be formed using a polymer such as a silicone or other soft or compliant materials. After molding, the cavities are filled with the higher conductivity material using a batch process such as screen or stencil printing.

Another fabrication approach consists of first encapsulating the entire package substrate with the standard molding compound (using a mold chase with no pedestals), then masking a surface of the applied molding compound in some regions and removing the molding compound from the other unmasked locations (e.g., areas where a high thermal conductivity material is desired). Options for material removal can include wet or dry etching, water blast technology (analogous to sandblasting), laser ablation, skiving, and the like. The cavities are then filled with the higher conductivity material as with other approaches addressed herein.

Instead of creating and filling few large cavities on top of each die (e.g., FIG. 1C), an alternative embodiment consists of creating a mesh of smaller pillars or vias filled with the high conductivity material. This may simply entail decreasing the size of element 103 of FIG. 1A and increasing the number of such projections to 5, 10, 15, 20 or more such projections (and corresponding apertures that are to be filled with high thermal conductivity material). This can be advantageous, for example, for enhancing the adhesion of the high conductivity material to the package by increasing the contact surface area between the high conductivity material and the molding compound. The exact shapes (e.g., square X-section, round X-section, and the like) and patterns (e.g., staggered, aligned, and the like) of the pillars can be optimized for structural and thermal benefits.

Although some embodiments do not require a thermal solution in the end use case to be useful, there are some embodiments that are quite beneficial for systems with an end-use cooling solution.

Figure 3:
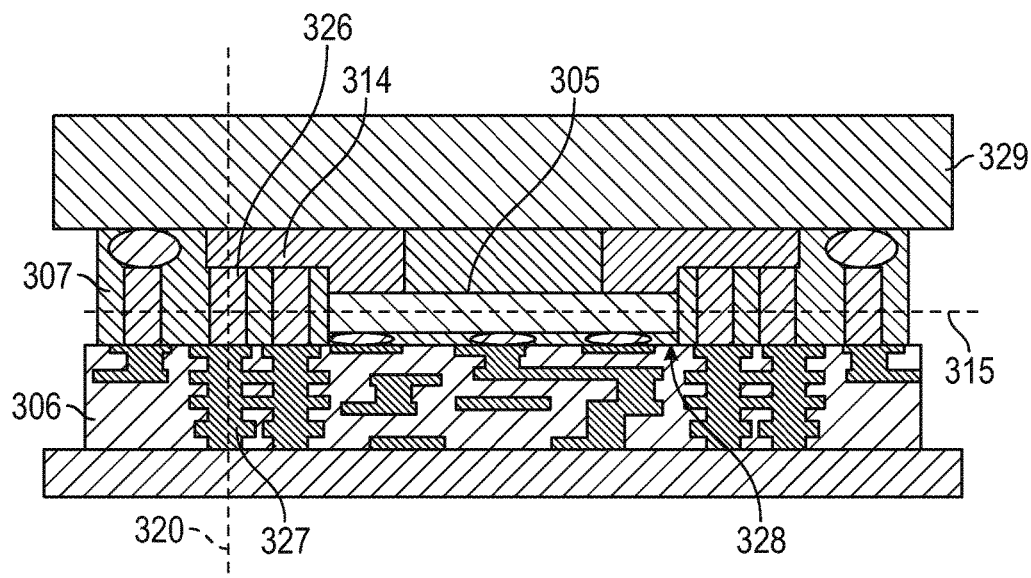
FIG. 3 includes a multi-package embodiment with board side cooling.

For instance, one embodiment can be used in conjunction with through-mold vias and substrate thermal vias to transfer heat to the board side (as will be addressed with FIG. 3). This helps enhance thermal management in use applications in which only the bottom side of the substrate or board, and not the molding material side, is cooled or placed in contact with a colder surface, such as the chassis of a smartphone or tablet or other computing node chassis. In the embodiment of FIG. 3, part of the heat generated by the die is extracted by the higher conductivity material which then spreads it and transfers it to the board side through the thermal vias in the molding material and substrate. This can provide a lower thermal resistance path than if the heat from the die can only travel down to the board across the substrate portion under the die shadow, since this portion of the substrate cannot have many (or in some cases, any) thermal vias due to routing space constraints.

FIG. 3 includes an embodiment including more than one package. The structure includes substrate 306; a first via 326 included in the package molding 307; and a second via 327 (e.g., via 327 is composed of a set of stacked substrate vias) included in the substrate. The package molding 307 includes a third surface 328 between the die 305 and the substrate 306. The first via 326 couples the rigid polymer 314 to the second via 327 through the third surface 328. Die 305 includes a major first axis 315; and a second axis 320, orthogonal to the first axis, intersects the first via but not the semiconductor die. In an embodiment an additional semiconductor die is included within an additional package 329; wherein axis 320 intersects the additional package and the first via 326 but not the semiconductor die 305. In an embodiment the rigid polymer 314 is between semiconductor die 305 and the additional semiconductor die of package 329.

The above embodiment of FIG. 3 can be particularly useful for cooling the top package in a stacked package (e.g., package on package (PoP)) architecture with board side cooling. The embodiment creates a low thermal resistance path between the top package and the board side where cooling is applied. This low thermal resistance path consists of the high conductivity material, through mold vias (i.e., vias that extend from one surface of package molding to an opposite surface of the package molding), and thermal vias in the substrate. In this architecture, the through-mold via process is convenient because it is used anyway in order to create electrical connections (e.g., power, ground, I/O interconnects) between the top package and the bottom substrate. Therefore, additional thermal vias can be created by simply modifying the lithography mask and otherwise using the same process without incurring additional steps. This makes embodiments such as the embodiment of FIG. 3 attractive for thermal management of stacked package architectures.

Another embodiment, as will be discussed with FIG. 4, can be used to enhance cooling of a bottom die in a double sided package configuration with top side cooling. In this case, a low thermal resistance path is created between the bottom die and the cooling solution by means of the substrate vias, through mold vias, and the higher conductivity material. Compared to using substrate and through mold vias only (with no high conductivity material on top), the embodiment provides better heat spreading with proper choice of the high conductivity material. The cooling solution is applied on the molding material side.

Figure 4:
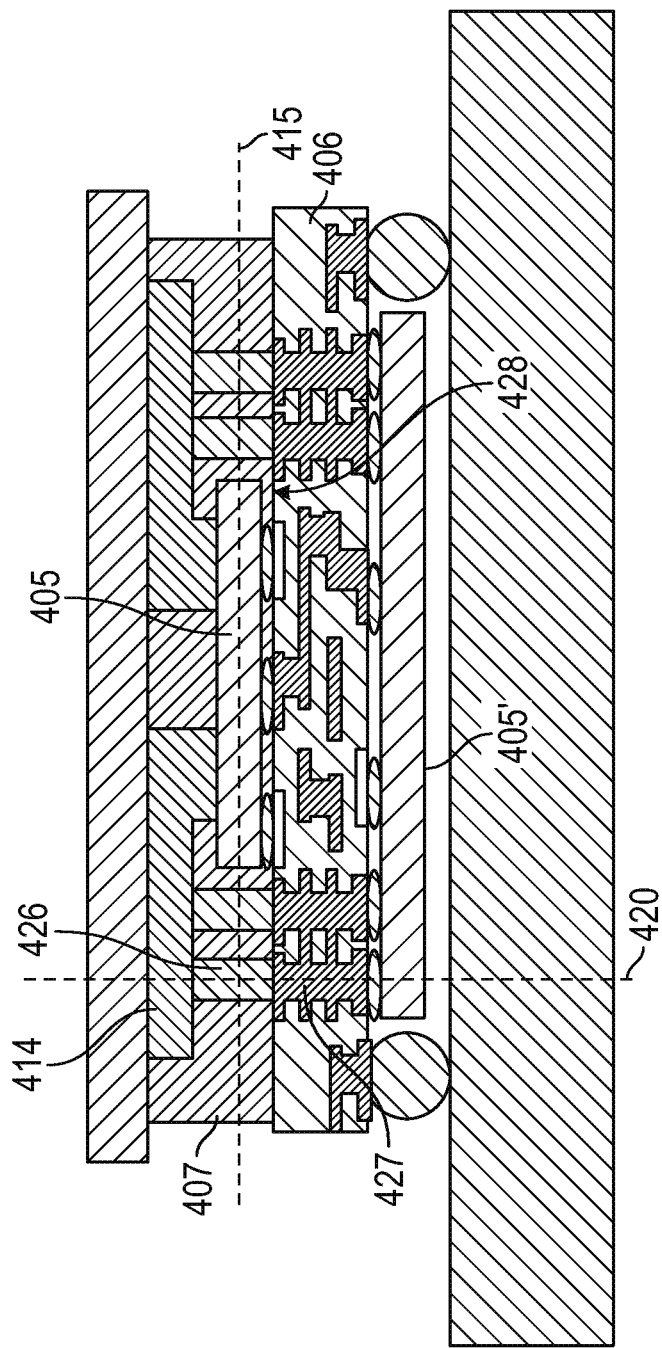
FIG. 4 includes a multi-package embodiment with package side cooling.

FIG. 4 includes an embodiment including more than one die. The structure includes substrate 406; a first via 426 included in the package molding 407; and a second via 427 included in the substrate. The package molding includes a third surface 428 between the die 405 and the substrate 406. The first via 426 couples the rigid polymer 414 to the second via 427 through the third surface 428. Die 405 includes a major first axis 415; and a second axis 420, orthogonal to the first axis, intersects the first via but not the semiconductor die. In an embodiment an additional semiconductor die 405' is included. Axis 420 intersects the additional semiconductor die 405' and the first via 426 but not the semiconductor die 405. In an embodiment the semiconductor die 405 is between the rigid polymer 414 and additional semiconductor die 405'.

Thus, embodiments described herein provide advantages over other methods.

For example, using an exposed die molded package (where package molding is not on a top surface of the die in order to promote better cooling) can lead to complications such as flow challenges during molding as well as significant assembly challenges. In addition, an exposed die mold does not allow for thermal management of MCPs containing die of different thicknesses (e.g., FIG. 2A), since the thinner die will get covered by the molding compound. As a further illustration, note the configuration of FIG. 1C is different from exposed die configurations or derivatives thereof (e.g., exposed die with TIM) since a major portion of the package is still covered by the standard molding compound in the embodiment of FIG. 1C, and the die is not exposed. This alleviates the assembly and processing issues often encountered with exposed die packages and enables architectures with multiple die of different heights (FIG. 2C).

As another example, embodiments are advantageous over custom engineered high thermal conductivity molding materials that may require relatively exotic chemistries in exchange for standard packaging materials. In other words, using a custom-engineered high conductivity molding material suffers from the high cost of formulating those materials. Moreover, high conductivity is often attained by increasing the % of filler particles in the epoxy, which negatively impacts the flow properties (e.g., viscosity) necessary to achieve successful molding. The high % filler also alters the designed-for mechanical properties (e.g., modulus). Moreover, the maximum achievable thermal conductivity even for those custom materials is limited.

Embodiments are advantageous over assembling copper slugs on top of the die after selective molding material removal because of the difficulty in making and placing such slugs. In other words, placing a copper or high conductivity metal slug in the molding material cavity above the die suffers from the cost associated with machining and assembling those slugs, as well as the lower throughput resulting from the need to assemble each slug (or multiple slugs) separately to each package through serial pick and place (PnP) processes versus a batch processing like the one proposed in embodiments described herein (i.e., printing).

Compared to the above approaches (e.g., exposed die, high conductivity molding materials, metal slugs), embodiments enable batch fabrication of multiple structures with a much higher thermal conductivity than standard molding materials, across multiple packages at panel or strip level, using a single or few HVM compatible steps. Embodiments do not require the formulation of a new mold material or an exposed die process and allow for successful thermal management of packages containing multiple die with different thicknesses.

Figure 7:
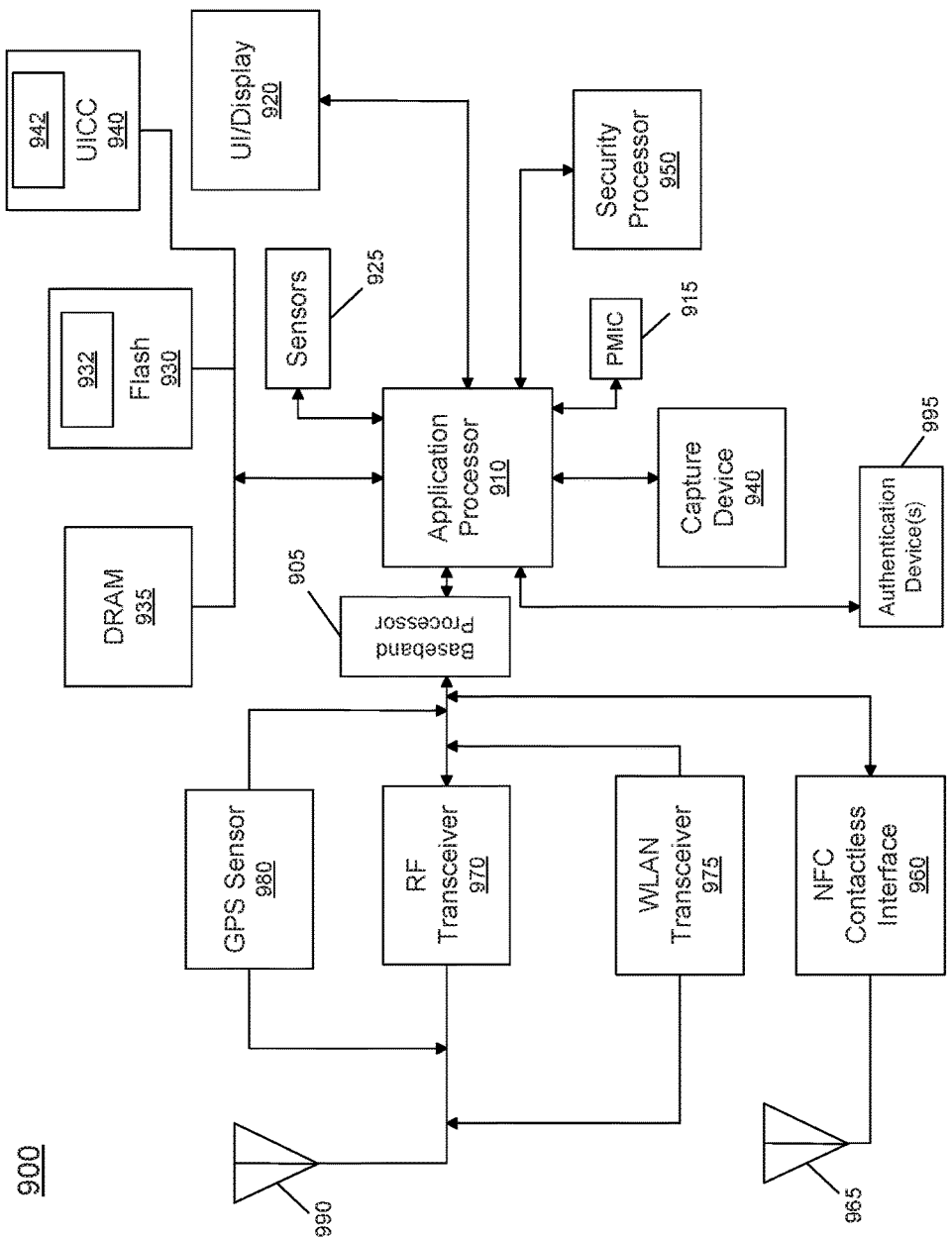
FIGS. 7 and 8 include systems that incorporate embodiments.

Referring now to FIG. 7, shown is a block diagram of an example system with which embodiments can be used. As seen, system 900 may be a smartphone or other wireless communicator or any other Internet of Things (IoT) device. A baseband processor 905 (which may include the thermal management of embodiments described herein) is configured to perform various signal processing with regard to communication signals to be transmitted from or received by the system. In turn, baseband processor 905 is coupled to an application processor 910 (which may include the thermal management of embodiments described herein), which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 (which may be included in a PoP that includes the thermal management of embodiments described herein) may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) (which may include the thermal management of embodiments described herein) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include the thermal management of embodiments described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 8:
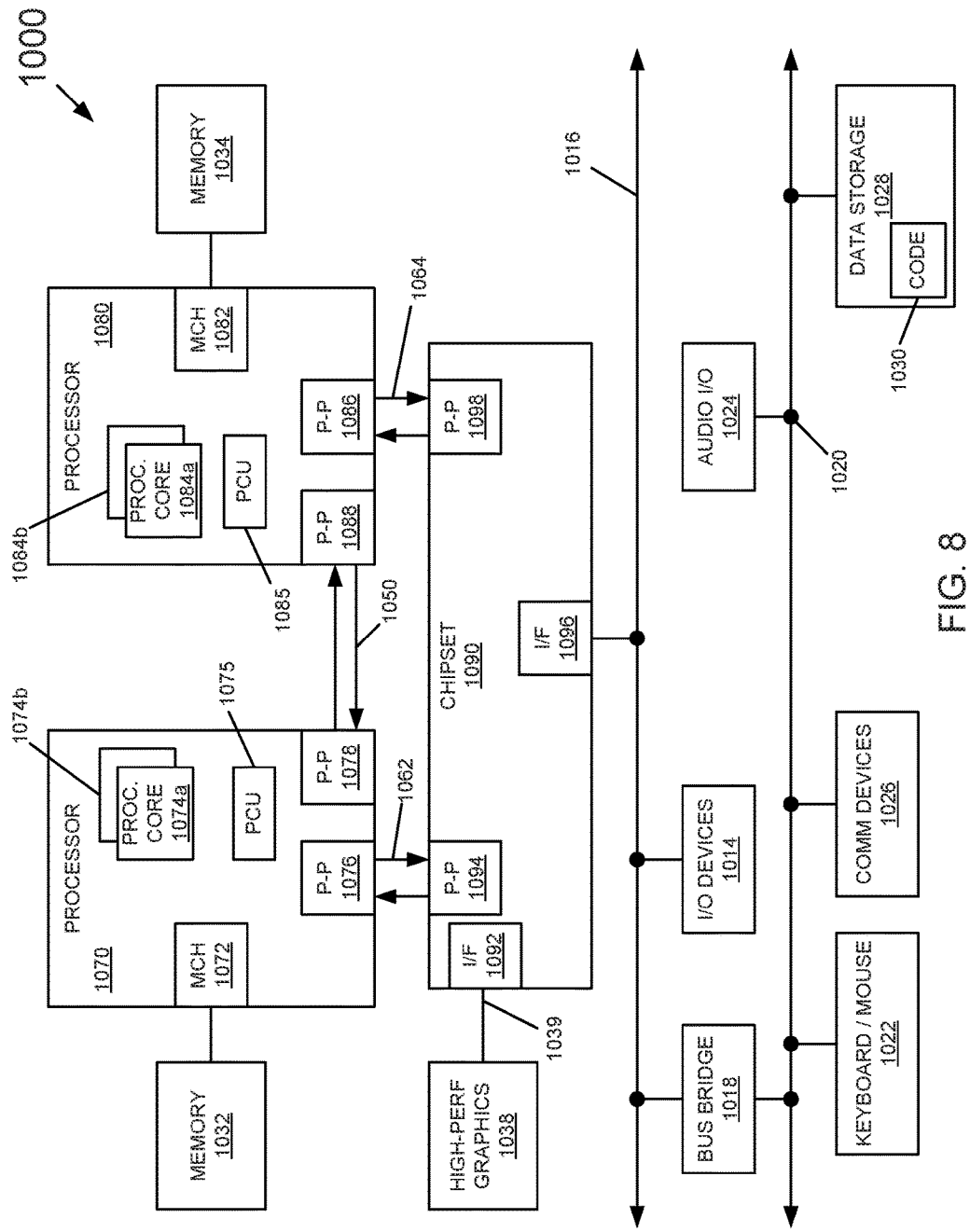

Referring now to FIG. 8, shown is a block diagram of a system in accordance with another embodiment of the present invention. Multiprocessor system 1000 is a point-to-point interconnect system such as a server system, and includes a first processor 1070 (which may include the thermal management of embodiments described herein) and a second processor 1080 (which may include the thermal management of embodiments described herein) coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors (memory and processors may be included in PoP embodiments described herein). First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

The following examples pertain to further embodiments.

Example 1 includes an apparatus comprising: a semiconductor die; package molding that is molded onto and conformal with a first surface of the semiconductor die and at least two sidewalls of the semiconductor die, the package molding including: (a)(i) a first surface contacting the semiconductor die, (a)(ii) a second surface opposite the first surface, and (a)(iii) an aperture that extends from the first surface to the second surface; and a rigid polymer substantially filling the aperture.

The die can be electrically connected to a substrate using flip chip bumps, and/or wire bonds. Further, the die can be an active component (with transistors) or a passive component such as a capacitor or inductor.

Another version of example 1a includes an apparatus comprising: a semiconductor die; package molding that is molded onto and conformal with a first surface of the semiconductor die and at least two sidewalls of the semiconductor die, the package molding including: (a)(i) a first surface contacting the semiconductor die, (a)(ii) a second surface opposite the first surface, and (a)(iii) an aperture or plurality of apertures that extends from the first surface to the second surface; and a rigid thermally conductive polymer substantially filling the aperture, in which the thermal conductivity of this rigid polymer is higher than the thermal conductivity of the package molding.

Example 2 includes the apparatus of example 1, wherein: the semiconductor die includes a major first axis; a second axis, parallel to the first axis, intersects the polymer; and the second axis intersects the package molding on opposing sides of the polymer.

Example 3 includes the apparatus of example 2, wherein the aperture includes sidewalls that are smooth.

Another version of Example 3 includes the apparatus of example 2, wherein the aperture includes sidewalls that are smooth and either straight or tapered creating an entrance hole at the second surface that is larger than that at the first surface Example 4 includes the apparatus of example 3, wherein the sidewalls are non-circular in a cross-section taken in a plane parallel to the first and second axes.

Another version of example 4 includes the apparatus of example 3, wherein the sidewalls are any shape (e.g., circular, noncircular, squares, rectangles, triangles, and trenches) in a cross-section taken in a plane parallel to the first and second axes.

Example 5 includes the apparatus of example 2, wherein the package molding includes a first thermal conductivity (watts per meter kelvin (W/(m·K)) and the polymer includes a second thermal conductivity that is greater than the first thermal conductivity.

Example 6 includes the apparatus of example 5 comprising a substrate, wherein: the semiconductor die includes a second surface, opposite the first surface, which is between the die and the substrate; the semiconductor die is between the substrate and the package molding; a third axis, orthogonal to the first and second axes, intersects the package molding and the semiconductor die but not the polymer; and a fourth axis, parallel to the third axis, intersects the polymer and the semiconductor die but not the package molding.

Example 7 includes the apparatus of example 5 wherein the first thermal conductivity is less than 1 W/(m·K) and the second thermal conductivity is greater than 3 W/(m·K).

Another version of example 7 includes Example 7 includes the apparatus of example 5 wherein the first thermal conductivity is less than 1 W/(m·K) and the second thermal conductivity is greater than 9 W/(m·K).

Example 8 includes the apparatus of example 5, wherein: the package molding comprises a polymer selected from the group consisting of a thermoset epoxy, a silicone, a thermoplastic polymer, a liquid crystal polymer, and mixtures thereof; and the rigid polymer includes metal particles.

Another version of Example 8 includes the apparatus of example 5, wherein: the package molding comprises a polymer selected from the group consisting of a thermoset epoxy, a silicone, a thermoplastic polymer, a liquid crystal polymer, and mixtures thereof; and the thermally conductive polymer includes metal or thermally conductive particles forming a percolated or sintered network.

Example 9 includes the apparatus of example 2 wherein in a plane parallel to the first axis the rigid polymer is completely surrounded by the package molding.

Example 10 includes the apparatus of example 2 comprising: an additional semiconductor die; and additional package molding that is molded onto an additional first surface of the additional semiconductor die and at least two additional sidewalls of the additional semiconductor die; wherein: (c)(i) the semiconductor die includes a height measured orthogonal to the first axis and the additional semiconductor die includes an additional height that is unequal to the height of the semiconductor die, (c)(ii) the package molding and the additional package molding are monolithic with each other.

Another version of Example 10 includes the apparatus of example 2 comprising: an additional semiconductor die; and additional package molding that is molded onto an additional first surface of the additional semiconductor die and at least two additional sidewalls of the additional semiconductor die; wherein: (c)(i) the semiconductor die includes a height measured orthogonal to the first axis and the additional semiconductor die includes an additional height that is equal to the height of the semiconductor die, (c)(ii) the package molding and the additional package molding are formed from the same material.

Example 11 includes the apparatus of example 10, wherein the additional package molding includes: (b)(i) an additional first surface contacting the additional semiconductor die, (b)(ii) an additional second surface opposite the additional first surface, and (b)(iii) an additional aperture that extends from the additional first surface to the additional second surface; and an additional rigid polymer, substantially filling the additional aperture, that includes metal particles.

Another version of example 11 includes the apparatus of example 10, wherein the additional package molding includes: (b)(i) an additional first surface contacting the additional semiconductor die, (b)(ii) an additional second surface opposite the additional first surface, and (b)(iii) an additional aperture that extends from the additional first surface to the additional second surface; and an additional rigid polymer, substantially filling the additional aperture, that includes suspended or sintered metal or thermally conductive particles.

Example 12 includes the apparatus of example 1 wherein the rigid polymer directly contacts the semiconductor die.

Another version of example 12 includes the apparatus of example 1 wherein the rigid polymer directly contacts a semiconductor die stack (e.g., a stack of die with through-silicon vias and/or wirebonds).

Example 13 includes the apparatus of example 1 comprising: an additional semiconductor die; additional package molding that is molded onto and conformal with an additional first surface of the additional semiconductor die and at least two additional sidewalls of the additional semiconductor die, the additional package molding including: (b)(i) an additional first surface contacting the additional semiconductor die, (b)(ii) an additional second surface opposite the additional first surface, and (b)(iii) an additional aperture that extends from the additional first surface to the additional second surface; and an additional rigid polymer, substantially filling the additional aperture, that includes metal particles; wherein: (c)(i) the semiconductor die includes a second surface opposite the first surface, (c)(ii) the additional semiconductor die includes an additional second surface opposite the additional first surface, (c)(iii) the second surface and the additional second surface are substantially coplanar with each other, and (c)(iv) the first surface and the additional first surface are not substantially coplanar with each other.

Another version of example 13 includes the apparatus of example 1 comprising: an additional semiconductor die; additional package molding that is molded onto and conformal with an additional first surface of the additional semiconductor die and at least two additional sidewalls of the additional semiconductor die, the additional package molding including: (b)(i) an additional first surface contacting the additional semiconductor die, (b)(ii) an additional second surface opposite the additional first surface, and (b)(iii) an additional aperture that extends from the additional first surface to the additional second surface; and an additional thermally conductive polymer, substantially filling the additional aperture, that includes or sintered metal or thermally conductive particles; wherein: (c)(i) the semiconductor die includes a second surface opposite the first surface, (c)(ii) the additional semiconductor die includes an additional second surface opposite the additional first surface, (c)(iii) the second surface and the additional second surface are substantially coplanar with each other, and (c)(iv) the first surface and the additional first surface are not substantially coplanar with each other.

Another version of example 13 includes the apparatus of example 1 comprising: an additional semiconductor die; additional package molding that is molded onto and conformal with an additional first surface of the additional semiconductor die and at least two additional sidewalls of the additional semiconductor die, the additional package molding including: (b)(i) an additional first surface contacting the additional semiconductor die, (b)(ii) an additional second surface opposite the additional first surface, and (b)(iii) an additional aperture that extends from the additional first surface to the additional second surface; and an additional thermally conductive polymer, substantially filling the additional aperture, that includes or sintered metal or thermally conductive particles; wherein: (c)(i) the semiconductor die includes a second surface opposite the first surface, (c)(ii) the additional semiconductor die includes an additional second surface opposite the additional first surface, (c)(iii) the second surface and the additional second surface are substantially coplanar with each other.

Example 14 includes the apparatus of example 13 wherein the package molding and the additional package molding are monolithic with each other.

Another version of example 14 includes the apparatus of example 13 wherein the package molding and the additional package molding are formed from the same material.

Example 15 includes the apparatus of example 1 wherein: the package molding includes at least one additional aperture that extends from the first surface to the second surface; and at least one additional rigid polymer, substantially filling the at least one additional aperture, that includes additional suspended metal particles.

Another version of example 15 includes the apparatus of example 1 wherein: the package molding includes at least one additional aperture that extends from the first surface to the second surface; and at least one additional thermally conductive polymer, substantially filling the at least one additional aperture, that includes additional suspended or sintered metal or thermally conductive particles.

Example 16 includes The apparatus of example 1 comprising: a substrate; a first via included in the package molding; and a second via included in the substrate; wherein: (b)(i) the package molding includes a third surface between the die and the substrate, (b)(ii) the first via couples the rigid polymer to the second via through the third surface.

Example 17 includes the apparatus of example 16, wherein: the semiconductor die includes a major first axis; and a second axis, orthogonal to the first axis, intersects the first via but not the semiconductor die.

Example 18 includes the apparatus of example 1 comprising: a substrate; a first via included in the package molding; wherein: (b)(i) the package molding includes a third surface between the die and the substrate, (b)(ii) the first via couples the rigid polymer to the third surface.

Example 19 includes the apparatus of example 18 comprising: an additional semiconductor die included within an additional package; wherein: (c)(i) the semiconductor die includes a major first axis; (c)(ii) a second axis, orthogonal to the first axis, intersects the additional package and the first via but not the semiconductor die.

Example 20 includes the apparatus of example 19 wherein the semiconductor die is between the rigid polymer and the additional semiconductor die.

Example 21 includes the apparatus of example 19 wherein the rigid polymer is between the semiconductor die and the additional semiconductor die.

Example 22 includes a system comprising: a memory; and a processor coupled to the memory, wherein at least one of the processor and the memory are included in the package molding according to any one of examples 1 to 21.

Another version of example 22 includes the apparatus of example 1 a memory; and a processor coupled to the memory, wherein at least one of the processor and the memory include the semiconductor die and the package molding.

Example 23 includes a method comprising: providing a mold chase that includes a first surface and a first projection that projects away from the first surface; contacting the first projection to a first semiconductor die to provide a first space that exists on at least two sides of the first projection and between the first surface and the semiconductor die; providing package molding within the first space and directly contacting the mold chase, the first projection, and the semiconductor die; disconnecting the first projection from the semiconductor die to provide package molding that is molded onto and conformal with a first surface of the first semiconductor die and at least two sidewalls of the first semiconductor die, the package molding including: (a)(i) a first surface contacting the first semiconductor die, (a)(ii) a second surface opposite the first surface, and (a)(iii) a first aperture that extends from the first surface to the second surface; and substantially filling the first aperture with a polymer that includes metal particles.

Another version of example 23 includes a method comprising: providing a mold chase that includes a first surface and a first projection that projects away from the first surface; contacting the first projection to a first semiconductor die to provide a first space that exists on at least two sides of the first projection and between the first surface and the semiconductor die; providing package molding within the first space and directly contacting the mold chase, the first projection, and the semiconductor die; disconnecting the first projection from the semiconductor die to provide package molding that is molded onto and conformal with a first surface of the first semiconductor die and at least two sidewalls of the first semiconductor die, the package molding including: (a)(i) a first surface contacting the first semiconductor die, (a)(ii) a second surface opposite the first surface, and (a)(iii) a first aperture that extends from the first surface to the second surface; and substantially filling the first aperture with a thermally conductive polymer that includes suspended or sintered metal or thermally conductive particles.

Example 24 includes the method of example 23 comprising: providing the mold chase that also includes a second projection that projects away from the first surface, the second projection projecting further away from the first surface than the first projection; contacting the second projection to a second semiconductor die to provide a second space that exists on at least two sides of the second projection and between the first surface and the semiconductor die; providing the package molding within the second space and directly contacting the mold chase, the second projection, and the second semiconductor die; disconnecting the second projection from the second semiconductor die to provide the package molding that is molded onto and conformal with a first surface of the second semiconductor die and at least two sidewalls of the second semiconductor die, the package molding including: (a)(i) the first surface contacting the second semiconductor die, and (a)(ii) a second aperture that extends from the first surface to the second surface; and substantially filling the second aperture with the polymer.

Another version of Example 24 includes the method of example 23 comprising: providing the mold chase that also includes a second projection that projects away from the first surface, the second projection projecting the same distance or a different distance away from the first surface compared to the first projection; contacting the second projection to a second semiconductor die to provide a second space that exists on at least two sides of the second projection and between the first surface and the second semiconductor die; providing the package molding within the second space and directly contacting the mold chase, the second projection, and the second semiconductor die; disconnecting the second projection from the second semiconductor die to provide the package molding that is molded onto and conformal with a first surface of the second semiconductor die and at least two sidewalls of the second semiconductor die, the package molding including: (a)(i) the first surface contacting the second semiconductor die, and (a)(ii) a second aperture that extends from the first surface to the second surface; and substantially filling the second aperture with the polymer.

Example 25 includes the method of example 24 comprising simultaneously: contacting the first projection to the first semiconductor die and the second projection to the second semiconductor die; providing the package molding within the first and second spaces.

Example 1a includes an apparatus comprising: a semiconductor die; package molding that is molded onto and conformal with a first die surface of the semiconductor die and at least two sidewalls of the semiconductor die, the package molding including: (a)(i) a first surface contacting the semiconductor die, (a)(ii) a second surface opposite the first surface, and (a)(iii) an aperture that extends from the first surface to the second surface; and a polymer substantially filling the aperture; wherein the package molding includes a first thermal conductivity (watts per meter kelvin (W/(m·K)) and the polymer includes a second thermal conductivity that is greater than the first thermal conductivity.

Example 2a includes the apparatus of example 1, wherein: the semiconductor die includes a major first axis; a second axis, parallel to the first axis, intersects the polymer; and the second axis intersects the package molding on opposing sides of the polymer.

Example 3a includes the apparatus of example 2, wherein the aperture includes sidewalls that are smooth.

Example 4a includes the apparatus of example 3, wherein the sidewalls are non-circular in a cross-section taken in a plane parallel to the first and second axes.

Example 5a includes the apparatus of example 2 comprising a substrate wherein: the semiconductor die is on the substrate; the semiconductor die is configured to be electrically coupled to the substrate with a member selected from the group consisting of a bump interconnect and a wirebond; the semiconductor die comprises a member selected from the group consisting of a transistor, a capacitor, and an inductor; the semiconductor die is included in a die stack that includes additional semiconductor dies; and the additional semiconductor dies are located between the semiconductor die and the substrate.

Example 6a includes the apparatus of example 2 comprising a substrate, wherein: the semiconductor die includes a second die surface, opposite the first die surface, which is between the semiconductor die and the substrate; the semiconductor die is between the substrate and the package molding; a third axis, orthogonal to the first and second axes, intersects the package molding and the semiconductor die but not the polymer; and a fourth axis, parallel to the third axis, intersects the polymer and the semiconductor die but not the package molding.

Example 7a includes the apparatus of example 2 wherein the first thermal conductivity is less than 1 W/(m·K) and the second thermal conductivity is greater than 3 W/(m·K).

Example 8a includes the apparatus of example 2, wherein: the package molding comprises a polymer selected from the group consisting of a thermoset epoxy, a silicone, a thermoplastic polymer, a liquid crystal polymer, and mixtures thereof; and the polymer includes particles selected from the group consisting of metal particles and thermally conductive particles.

Example 9a includes the apparatus of example 8, wherein the particles form at least one of a percolated network and a sintered network.

For instance, a percolated mixture is one in which at least one connected path of the (conductive) particles exists which spans the entire polymer matrix from one side to another (e.g., from a top surface of polymer 114 to a bottom surface of polymer 114). A sintered mixture is one in which the particles are fused together under the application of temperature and/or pressure and may exist in concentrations higher than the critical value needed to achieve percolation.

Example 10a includes the apparatus of example 2 wherein in a plane parallel to the first axis the polymer is completely surrounded by the package molding.

Example 11a includes the apparatus of example 2 comprising: an additional semiconductor die; and additional package molding that is molded onto an additional first die surface of the additional semiconductor die and at least two additional sidewalls of the additional semiconductor die; wherein: (c)(i) the semiconductor die includes a height measured orthogonal to the first axis and the additional semiconductor die includes an additional height that is unequal to the height of the semiconductor die, (c)(ii) the package molding and the additional package molding are monolithic with each other.

Example 12a includes the apparatus of example 11, wherein the additional package molding includes: (b)(i) an additional first surface contacting the additional semiconductor die, (b)(ii) an additional second surface opposite the additional first surface, and (b)(iii) an additional aperture that extends from the additional first surface to the additional second surface; and an additional polymer, substantially filling the additional aperture, that includes particles selected from the group consisting of metal particles and thermally conductive particles.

Example 13a includes the apparatus of example 1 wherein the polymer directly contacts the semiconductor die.

Example 14a includes the apparatus of example 1 comprising: an additional semiconductor die; additional package molding that is molded onto and conformal with an additional first die surface of the additional semiconductor die and at least two additional sidewalls of the additional semiconductor die, the additional package molding including: (b)(i) an additional first surface contacting the additional semiconductor die, (b)(ii) an additional second surface opposite the additional first surface, and (b)(iii) an additional aperture that extends from the additional first surface to the additional second surface; and an additional polymer, substantially filling the additional aperture, that includes particles selected from the group consisting of metal particles and thermally conductive particles; wherein: (c)(i) the semiconductor die includes a second die surface opposite the first die surface, (c)(ii) the additional semiconductor die includes an additional second die surface opposite the additional first die surface, (c)(iii) the second die surface and the additional second die surface are substantially coplanar with each other, and (c)(iv) the first die surface and the additional first die surface are not substantially coplanar with each other.

Example 15a includes the apparatus of example 14 wherein the package molding includes a material having a material composition and the additional package molding includes an additional material having an additional material composition that is substantially equivalent to the material composition.

Example 16a includes the apparatus of example 1 wherein: the package molding includes at least one additional aperture that extends from the first surface to the second surface; at least one additional polymer, substantially filling the at least one additional aperture, that includes additional particles selected from the group consisting of metal particles and thermally conductive particles; and the additional particles form at least one of a percolated network and a sintered network.

Example 17a includes the apparatus of example 1 comprising: a substrate; a first via included in the package molding; and a second via included in the substrate; wherein: (b)(i) the package molding includes a third surface between the semiconductor die and the substrate, (b)(ii) the first via couples the polymer to the second via through the third surface.

Example 18a includes the apparatus of example 17, wherein: the semiconductor die includes a major first axis; and a second axis, orthogonal to the first axis, intersects the first via but not the semiconductor die.

Example 19a includes the apparatus of example 1 comprising: a substrate; a first via included in the package molding; wherein: (b)(i) the package molding includes a third surface between the semiconductor die and the substrate, (b)(ii) the first via couples the polymer to the third surface.

Example 20a includes the apparatus of example 19 comprising: an additional semiconductor die included within an additional package; wherein: (c)(i) the semiconductor die includes a major first axis; (c)(ii) a second axis, orthogonal to the first axis, intersects the additional package and the first via but not the semiconductor die.

Example 21a includes the apparatus of example 20 wherein the semiconductor die is between the polymer and the additional semiconductor die.

Example 22a includes the apparatus of example 20 wherein the polymer is between the semiconductor die and the additional semiconductor die.

Example 23a includes the apparatus of example 1 comprising: a memory; and a processor coupled to the memory, wherein at least one of the processor and the memory include the semiconductor die and the package molding.

Example 24a includes the apparatus of example 2, wherein: the aperture includes sidewalls that are tapered such that the aperture has a second opening adjacent the second surface and a first opening adjacent the first surface; and the second opening is larger than the first opening.

Example 23a includes the apparatus of example 2, wherein the aperture defines a trench.

Example 26a includes the apparatus of example 2 comprising a plurality of apertures that include the aperture, wherein: the plurality of apertures are respectively formed directly over a plurality of locations, included in the semiconductor die, that are configured to dissipate higher amounts of power than other areas of the semiconductor die that are not located directly below one of the plurality of apertures.

Example 27a includes the apparatus of example 2 comprising: an additional semiconductor die; and additional package molding that is molded onto an additional first die surface of the additional semiconductor die and at least two additional sidewalls of the additional semiconductor die; wherein: (c)(i) the semiconductor die includes a height measured orthogonal to the first axis and the additional semiconductor die includes an additional height that is substantially equal to the height of the semiconductor die, and (c)(ii) the package molding includes a material having a material composition and the additional package molding includes an additional material having an additional material composition that is substantially equivalent to the material composition.

Example 28a includes a method comprising: providing a mold chase that includes a first mold chase surface and a first projection that projects away from the first mold chase surface; contacting the first projection to a first semiconductor die to provide a first space that exists on at least two sides of the first projection and between the first mold chase surface and the semiconductor die; providing package molding within the first space and directly contacting the mold chase, the first projection, and the semiconductor die; disconnecting the first projection from the semiconductor die to provide package molding that is molded onto and conformal with a first die surface of the first semiconductor die and at least two sidewalls of the first semiconductor die, the package molding including: (a)(i) a first surface contacting the first semiconductor die, (a)(ii) a second surface opposite the first surface, and (a)(iii) a first aperture that extends from the first surface to the second surface; and substantially filling the first aperture with a polymer; wherein the package molding includes a first thermal conductivity (watts per meter kelvin (W/(m·K)) and the polymer includes a second thermal conductivity that is greater than the first thermal conductivity.

Example 29a includes the method of example 28 comprising: providing the mold chase that also includes a second projection that projects away from the first mold chase surface, the second projection projecting further away from the first mold chase surface than the first projection; contacting the second projection to a second semiconductor die to provide a second space that exists on at least two sides of the second projection and between the first mold chase surface and the semiconductor die; providing the package molding within the second space and directly contacting the mold chase, the second projection, and the second semiconductor die; disconnecting the second projection from the second semiconductor die to provide the package molding that is molded onto and conformal with a first die surface of the second semiconductor die and at least two sidewalls of the second semiconductor die, the package molding including: (a)(i) the first surface contacting the second semiconductor die, and (a)(ii) a second aperture that extends from the first surface to the second surface; and substantially filling the second aperture with the polymer.

Example 30a includes the method of example 29 comprising simultaneously: contacting the first projection to the first semiconductor die and the second projection to the second semiconductor die; and providing the package molding within the first and second spaces.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a semiconductor die;
   package molding that is molded onto and conformal with a first die surface of the semiconductor die and at least two sidewalls of the semiconductor die, the package molding including: (a)(i) a first surface contacting the semiconductor die, (a)(ii) a second surface opposite the first surface, and (a)(iii) an aperture that directly interfaces the first surface and the second surface;
   a polymer substantially filling the aperture;
   an additional semiconductor die; and
   additional package molding that is molded onto an additional first die surface of the additional semiconductor die and at least two additional sidewalls of the additional semiconductor die;
   wherein the package molding includes a first thermal conductivity (watts per meter kelvin (W/(m–K)) and the polymer includes a second thermal conductivity that is greater than the first thermal conductivity;
   wherein (b)(i) the semiconductor die includes a major first axis; (b)(ii) a second axis, parallel to the first axis, intersects the polymer; and (b)(iii) the second axis intersects the package molding on opposing sides of the polymer;
   wherein: (c)(i) the semiconductor die includes a height measured orthogonal to the first axis and the additional semiconductor die includes an additional height that is unequal to the height of the semiconductor die, and (c)(ii) the package molding and the additional package molding are monolithic with each other.

2. The apparatus of claim 1, wherein the aperture includes sidewalls that are smooth.

3. The apparatus of claim 2, wherein the sidewalls of the aperture are non-circular in a cross-section taken in a plane parallel to the first and second axes.

4. The apparatus of claim 1 comprising a substrate wherein:
   the semiconductor die is on the substrate;
   the semiconductor die is configured to be electrically coupled to the substrate with at least one of a bump interconnect or a wirebond;
   the semiconductor die comprises at least one of a transistor, a capacitor, or an inductor;
   the semiconductor die is included in a die stack that includes another semiconductor die; and
   the another semiconductor die is located between the semiconductor die and the substrate.

5. The apparatus of claim 1 comprising a substrate, wherein:
   the semiconductor die includes a second die surface, opposite the first die surface, which is between the semiconductor die and the substrate;
   the semiconductor die is between the substrate and the package molding;
   a third axis, orthogonal to the first and second axes, intersects the package molding and the semiconductor die but not the polymer; and
   a fourth axis, parallel to the third axis, intersects the polymer and the semiconductor die but not the package molding.

6. The apparatus of claim 1 wherein the first thermal conductivity is less than 1 W/(m–K) and the second thermal conductivity is greater than 3 W/(m–K).

7. The apparatus of claim 1, wherein:
   the package molding comprises a polymer that includes at least one of a thermoset epoxy, a silicone, a thermoplastic polymer, a liquid crystal polymer, or combinations thereof; and
   the polymer includes particles of at least one of metal particles, thermally conductive particles, or combinations thereof.

8. The apparatus of claim 7, wherein the particles form at least one of a percolated network, a sintered network, or a combination thereof.

9. The apparatus of claim 1 wherein in a plane parallel to the first axis the polymer is completely surrounded by the package molding.

10. The apparatus of claim 1, wherein:
    the additional package molding includes: (d)(i) an additional first surface contacting the additional semiconductor die, (d)(ii) an additional second surface opposite the additional first surface, and (d)(iii) an additional aperture that directly interfaces the additional first surface and the additional second surface; and
    an additional polymer, substantially filling the additional aperture, that includes at least one of metal particles, thermally conductive particles, or combinations thereof.

11. The apparatus of claim 1 wherein the polymer directly contacts the semiconductor die.

12. The apparatus of claim 1:
    wherein the additional package molding includes: (d)(i) an additional first surface contacting the additional semiconductor die, (d)(ii) an additional second surface opposite the additional first surface, and (d)(iii) an additional aperture that directly interfaces the additional first surface and the additional second surface; and
    wherein the apparatus further comprises an additional polymer, substantially filling the additional aperture, that includes at least one of metal particles, thermally conductive particles, or combinations thereof;
    wherein: (e)(i) the semiconductor die includes a second die surface opposite the first die surface, (e)(ii) the additional semiconductor die includes an additional second die surface opposite the additional first die surface, (e)(iii) the second die surface and the additional second die surface are substantially coplanar with each other, and (e)(iv) the first die surface and the additional first die surface are not substantially coplanar with each other.

13. The apparatus of claim 12 wherein the package molding includes a material having a material composition and the additional package molding includes an additional material having an additional material composition that is substantially equivalent to the material composition.

14. The apparatus of claim 1 wherein:
    the package molding includes at least one additional aperture that directly interfaces the first surface and the second surface;
    the apparatus further comprises at least one additional polymer, substantially filling the at least one additional aperture, that includes additional particles that include at least one of metal particles, thermally conductive particles, or combinations thereof; and
    the additional particles form at least one of a percolated network, a sintered network, or a combination thereof.

15. The apparatus of claim 1 comprising:
    a substrate;
    a first via included in the package molding; and
    a second via included in the substrate;
    wherein the first via couples the polymer to the second via.

16. The apparatus of claim 15, wherein:
a third axis, orthogonal to the first axis, intersects the first via but not the semiconductor die.

17. The apparatus of claim 1 comprising:
a substrate;
a first via included in the package molding;
wherein: (d)(i) the package molding includes a third surface between the semiconductor die and the substrate, (d)(ii) the first via couples the polymer to the third surface, (d)(iii) the third surface is between the first surface and the substrate, and (d)(iv) the third surface is between the second surface and the substrate.

18. The apparatus of claim 17:
wherein a third axis, orthogonal to the first axis, intersects the additional package and the first via but not the semiconductor die.

19. The apparatus of claim 18 wherein the semiconductor die is between the polymer and the additional semiconductor die.

20. The apparatus of claim 18 wherein the polymer is between the semiconductor die and the additional semiconductor die.

21. The apparatus of claim 1 comprising:
a memory; and
a processor coupled to the memory,
wherein at least one of the processor or the memory includes the semiconductor die and the package molding.

22. The apparatus of claim 1, wherein:
the aperture includes sidewalls that are tapered such that the aperture has a second opening adjacent the second surface and a first opening adjacent the first surface; and
the second opening is larger than the first opening.

23. The apparatus of claim 1, wherein the aperture defines a trench.

24. The apparatus of claim 1 comprising a plurality of apertures that include the aperture, wherein:
the plurality of apertures are respectively formed directly over a plurality of locations, included in the semiconductor die, that are configured to dissipate higher amounts of power than other areas of the semiconductor die that are not located directly below one of the plurality of apertures.

25. An apparatus comprising:
a semiconductor die;
package molding that is molded onto and conformal with a first die surface of the semiconductor die and at least two sidewalls of the semiconductor die, the package molding including: (a)(i) a first surface contacting the semiconductor die, (a)(ii) a second surface opposite the first surface, and (a)(iii) an aperture that directly interfaces the first surface and the second surface;
a polymer substantially filling the aperture;
an additional semiconductor die; and
additional package molding that is molded onto an additional first die surface of the additional semiconductor die and at least two additional sidewalls of the additional semiconductor die;
wherein the package molding includes a first thermal conductivity (watts per meter kelvin (W/(m-K)) and the polymer includes a second thermal conductivity that is greater than the first thermal conductivity;
wherein: (b)(i) the semiconductor die includes a height measured orthogonal to the first axis and the additional semiconductor die includes an additional height that is substantially equal to the height of the semiconductor die, and (b)(ii) the package molding includes a material having a material composition and the additional package molding includes an additional material having an additional material composition that is substantially equivalent to the material composition.

26. The apparatus of claim 25 comprising a substrate, wherein:
the semiconductor die includes a second die surface, opposite the first die surface, which is between the semiconductor die and the substrate;
the semiconductor die is between the substrate and the package molding;
a third axis, orthogonal to the first and second axes, intersects the package molding and the semiconductor die but not the polymer; and
a fourth axis, parallel to the third axis, intersects the polymer and the semiconductor die but not the package molding.

27. The apparatus of claim 25 comprising:
a substrate;
a first via included in the package molding;
wherein: (b)(i) the package molding includes a third surface between the semiconductor die and the substrate, (b)(ii) the first via couples the polymer to the third surface, (b)(iii) the third surface is between the first surface and the substrate, and (b)(iv) the third surface is between the second surface and the substrate.

* * * * *